United States Patent [19]
Ichiyanagi et al.

[11] Patent Number: 5,809,420
[45] Date of Patent: Sep. 15, 1998

[54] TRANSMISSION POWER CONTROL APPARATUS

[75] Inventors: Kazuhiro Ichiyanagi; Kazuyoshi Nagai, both of Kawasaki, Japan

[73] Assignee: Fujitsu Limited, Kanagawa, Japan

[21] Appl. No.: 731,141

[22] Filed: Oct. 10, 1996

[30] Foreign Application Priority Data

May 31, 1996 [JP] Japan .................................. 8-138154

[51] Int. Cl.⁶ .................................................. H04B 1/04
[52] U.S. Cl. ........................ 455/103; 455/3.2; 455/430; 455/12.1; 455/126; 455/127
[58] Field of Search .......................... 455/3.2, 427, 430, 455/12.1, 13.4, 103, 115, 126, 127, 117

[56] References Cited

U.S. PATENT DOCUMENTS

| | | | |
|---|---|---|---|
| 3,737,782 | 6/1973 | Pierce | 455/115 |
| 4,491,973 | 1/1985 | Idol | 455/115 |
| 5,530,920 | 6/1996 | Takeda | 455/103 |
| 5,574,992 | 11/1996 | Cygan et al. | 455/115 |
| 5,659,892 | 8/1997 | Soleimani et al. | 455/103 |

FOREIGN PATENT DOCUMENTS 58-178640  10/1983  Japan .

*Primary Examiner*—Nguyen Vo
*Attorney, Agent, or Firm*—Helfgott & Karas, P C

[57] ABSTRACT

A transmission power control apparatus in a communication apparatus which synthesizes IF signals output from a plurality of channel units and emits the synthesized signal from an antenna. In the transmission power control apparatus, when none of channel units transmit an IF signal, a controller changes the connection of a power amplifier from the antenna over to a dummy antenna and supplies the output of the power amplifier to the dummy antenna, and instructs a predetermined number m of channel units to output IF signals, a reference voltage generator generates a reference voltage corresponding to a transmission wave number m, and a variable attenuator or a variable amplifier controls gain so that the difference between detected voltage corresponding to a transmission power and the reference voltage becomes zero.

4 Claims, 14 Drawing Sheets

FIG.2

| WAVE NUMBER | REFERENCE VOLTAGE |
|---|---|
| 1 | |
| 2 | |
| | |
| n | |

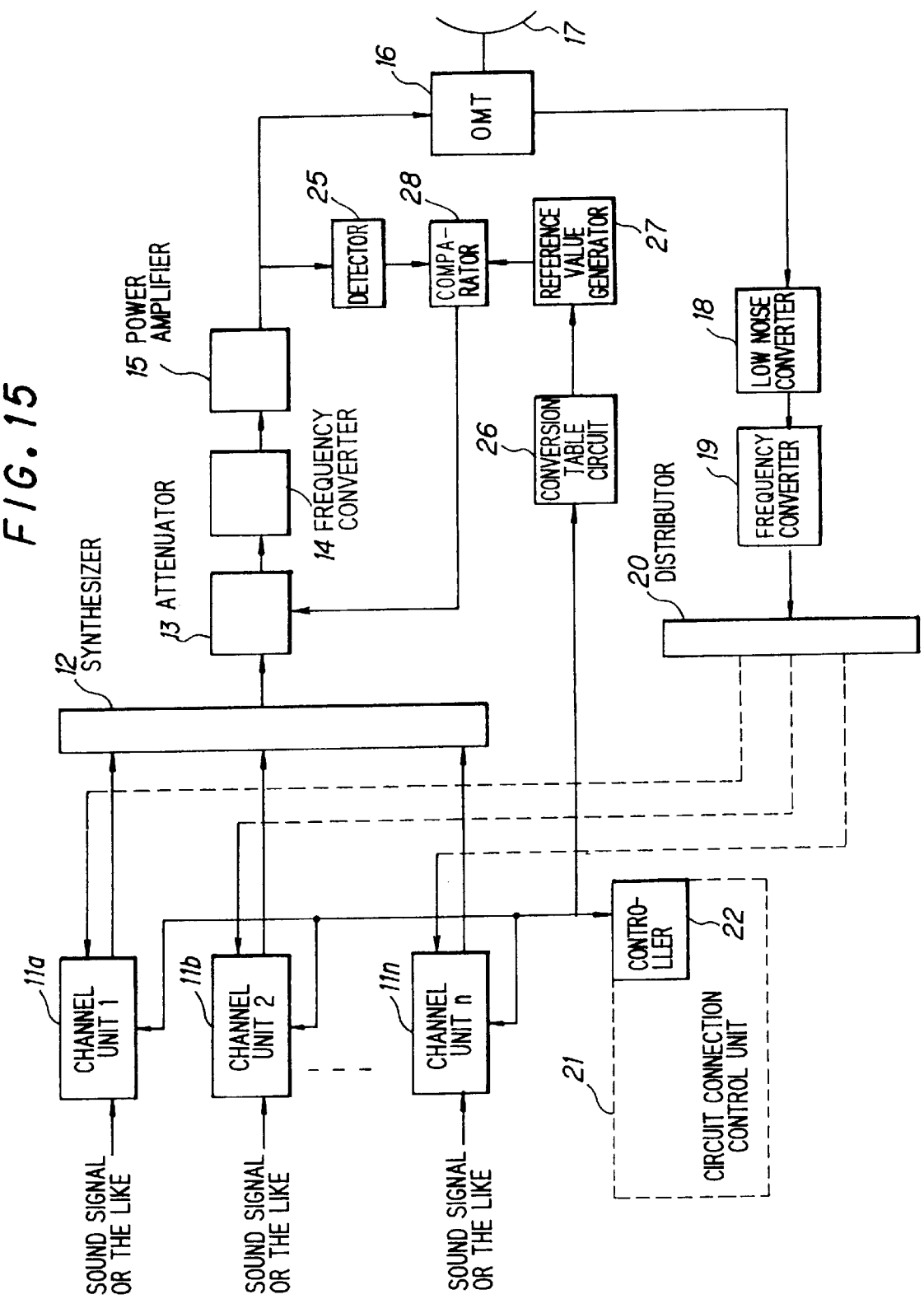

TRANSMISSION POWER CONTROL APPARATUS

BACKGROUND OF THE INVENTION

FIELD OF THE INVENTION

The present invention relates to a transmission power control apparatus in a communication apparatus such as a satellite communication earth station which is provided with a plurality of channel units each of which outputs IF signal obtained by modulating carrier of a predetermined frequency with a baseband signal such as a sound signal, synthesizes the IF signal output from each channel unit, and emits the synthesized signal from an antenna and, more particularly, to a transmission power control apparatus which controls the transmission power in a satellite communication earth station so as to be a preset value even if ambient conditions (temperature, frequency, etc.) change.

In satellite communication, a satellite earth station communicates with an earth station of a called party through a communication satellite. FIG. 12 shows the structure of a satellite communication system. In FIG. 12, the reference numeral 1 represents a communication satellite, 2 a control earth station (control station) for controlling the communication between earth stations, and 3a to 3m earth stations.

There are two communication modes adopted for the communication between earth stations: (1) an individual circuit mode for communicating at a communication channel frequency fi which is allotted by the control station and (2) a control circuit mode for communicating at a control channel frequency $f_0$ by inserting burst data (communication data) into a time slot which is allotted in accordance with a time-division multiplex system.

Each of the earth stations 3a to 3m is connected to the corresponding terminal unit such as a telephone through an exchange (not shown) so that a predetermined terminal unit is capable of being connected to a terminal unit of a called party through the exchange, the earth station, the communication satellite, the earth station of the called party and the exchange, thereby enabling communication. When one of the earth stations 3a to 3m is requested to be connected by the exchange, the earth station requests the control station 2 to allot a communication channel through the control channel. The control station 2 determines a communication channel of a predetermined frequency fi and informs the earth station of the caller party and the earth station of the called party of the allotted communication channel through the control channel. Thereafter, the earth station communicates through the allotted communication channel (individual circuit mode).

Each earth station is provided with a multiplicity of channel units, and each channel unit must periodically report the current state to the control unit and answer to a request from the control unit. In such a case, each channel unit supplies communication data in a time-division multiplex system through the control channel (control circuit mode).

FIG. 13 shows the structure of an earth station. In FIG. 13, the reference numerals 11a to 11n represent channel units. Each channel unit is connected to an exchange, modulates a frequency signal of a communication channel with a baseband signal such as a sound signal input from the exchange or demodulates a sound signal from a received signal, and outputs the sound signal to the exchange. The reference numeral 12 denotes a synthesizer for synthesizing the IF signals modulated by the respective channel units 11a to 11n, 13 an attenuator or a gain-variable amplifier (hereinafter only an attenuator will be explained) for making the level of the synthesized signal variable, 14 a frequency converter for converting the frequency of the synthesized signal into an RF frequency, 15 a power amplifier for amplifying the power of the RF signal which is output from the frequency converter 14, 16 an ortho mode transducer OMT for inputting the transmission signal amplified by the power amplifier 15 to an antenna and separating the RF signal received by the antenna and outputting it to the receiver side, 17 an antenna, 18 a low noise converter, 19 a frequency converter for converting the received RF signal into an IF signal, 20 a distributor for distributing the IF signal output from the frequency converter 19 to the respective channel units 11a to 11n, 21 a circuit connection control unit, and 22 a controller provided in the circuit connection control unit 21.

FIG. 14 shows the structure of a channel unit. In FIG. 14, the reference numeral 11 represents a channel unit, 21 a circuit connection control unit and 23 an exchange.

The channel unit 11 is composed of a transmission system, a reception system and a connection control system. In the transmission system, the reference numeral 30 represents a dial pulse converter which is connected to the exchange 23, and 31 a PCM portion for converting a sound signal from the exchange 23 into digital data at a predetermined sampling speed and converting PCM data demodulated by the reception system into an analog sound signal and inputting it to the exchange 23. The reference numeral 32 denotes an echo canceller, 33 an ADPCM portion, 34 a sound detector, 35 a transmission timing generator, 36 a multiplexer for inserting data into a predetermined time slot when the data is transmitted in a time-division multiplex system in the control circuit mode, 37 a scrambling portion, 38 an FEC (forward error correction) encoder for adding an error correction signal to a signal output from the scrambling portion and outputting an I signal and Q signal, 39 a waveform shaping filter, 40 an orthogonal modulator for multiplying the I signal and the Q signal by a frequency signal (carrier) of a communication channel and the signal obtained by shifting the phase thereof by 90°, respectively, adding the results of multiplication so as to obtain an IF signal as the orthogonally modulated signal, and 41 a synthesizer for producing a frequency signal of a communication channel or a frequency signal of a control channel, as occasion demands.

In the reception system, the reference numeral 42 represents an AGC circuit, 43 a synthesizer for producing a frequency signal of a communication channel or a frequency signal of a control channel, as occasion demands, 44 an orthogonal detector for multiplying the IF signal input by a frequency signal (carrier) of a communication channel and the signal obtained by shifting the phase thereof by 90°, respectively, so as to obtain the demodulated I signal and the Q signal, 45 a bandpass filter, 46 a digital demodulator, 47 an AFC portion, 48 a clock reproducer, 49 a Viterbi decoder for detecting and correcting an error, 50 a reception synchronism establishing portion, 51 a descrambling portion, 52 a reception timing generator and 53 a demultiplexer.

In the connection system, the reference numeral 54 denotes a connection controller, 55 and 56 HDLC portions, and 57 an RS-485 serial interface portion.

In the earth station of the caller party, when a request for connection is input to a predetermined channel unit 11a (FIG. 13) from the exchange 23, the circuit connection control unit 21 requests the control station 2 (see FIG. 12) to allot a communication channel through the control channel. When the control station 2 allots a communication channel in response to the demand, the circuit connection control unit 21 controls so that the frequency signal of the communication channel is output from the synthesizer 41 (FIG. 14). The control station 2 also reports the communication channel to the earth station of the called party.

The channel unit 11a then converts a sound signal or the like input from the exchange into PCM data, and converts the PCM data into an I signal and a Q signal after a scrambling process, an error correction code adding process, etc. The orthogonal modulator 40 provided in the channel unit 11a multiplies the I signal and the Q signal by the frequency signal (carrier) of the communication channel and the signal obtained by shifting the phase thereof by 90°, respectively, adds the results of multiplication for the purpose of orthogonal conversion, and outputs the orthogonally modulated signals as an IF signal.

The synthesizer 12 (FIG. 13) synthesizes the IF signals output from the channel units 11a to 11n, the attenuator controls the degree of the attenuation so that the synthesized signal has a predetermined level, and the frequency converter 14 converts the frequency of the synthesized signal into an RF frequency. The power amplifier 15 amplifiers the power of the RF signal up to a predetermined level and emits the RF signal from the antenna 17 toward the communication satellite through the OMT 16.

In the earth station of the called party, when the communication channel is reported from the control station 2, the circuit connection control unit 21 controls the synthesizer 43 (FIG. 14) on the receiver side of the channel unit to which the terminal unit of the called party is connected so as to output a frequency signal of the communication channel. In this state, the reception signal received from the antenna 17 is input to the frequency converter 19 through the QMT 16 and the low noise amplifier 18. The frequency converter 19 converts the reception signal to an IF signal and the distributor 20 distributes the IF signal to each of the channel units 11a to 11n.

The orthogonal detector 44 of the channel unit to which the terminal unit of the called party is connected through the exchange 23 multiplies the reception signal by a frequency signal of the communication channel and the signal obtained by shifting the phase thereof by 90°, respectively, for the purpose of orthogonal detection, and converts the signals into an analog sound signal and outputs the signal to the exchange 23 after digital demodulation, error detection and correction, and descrambling.

In the earth station, the stabilization of the transmission power is inevitable. The main causes of obstructing the stabilization of the transmission power in the earth station are (1) a difference in the level due to the temperature characteristics of an amplifier (especially, the frequency converter 14 and the power amplifier 15), and (2) a difference in the level due to the frequency characteristics.

The difference in the level due to the frequency characteristics is ameliorated by using an amplitude equalizer or the like at the time of initial adjustment. On the other hand, since the difference in the level due to the temperature characteristics varies with a change in the ambience (ambient temperature or the like) of the apparatus, the following transmission power control methods are proposed as the amelioration method.

A first method comprises the steps of obtaining an amplitude characteristic of the amplifier or the transmission system of the earth station with respect to a change in the temperature in advance; obtaining a level correction value with respect to each temperature; detecting the current ambient temperature by a temperature sensor or the like; and controlling the level by an attenuator or the like by using the level correction value with respect to the current temperature. According to the first method, although the temperature characteristics of the transmission system are compensated irrespective of the transmission power state (power on/off), when the transmission system is separated into an outdoor unit and an indoor unit, or when the ambience of the transmission system varies even if it is only composed of an indoor unit, the numbers of necessary temperature detectors, control circuits, etc. increase, thereby making the structure of the apparatus complicated.

A second method comprises the steps of: detecting the output power of the amplifier; comparing the power with a reference level; and controlling the power by the attenuator or the like. FIG. 15 shows the structure of the earth station provided with a function of controlling the transmission power by the second method. In FIG. 15, the same reference numerals are provided for the elements which are the same as those shown in FIG. 13. The reference numeral 25 denotes a detector for detecting the output level of the power amplifier 15, 26 a conversion table circuit for storing the correspondence between a transmission wave number and a reference voltage level, 27 a reference value generator for outputting the reference voltage corresponding to a transmission wave number, and 28 a comparator for outputting the difference between the voltage detected by the detector 25 and the reference voltage output from the reference value generator 27.

The controller 22 monitors the on/off state of each channel unit, and inputs the number of channel units (transmission wave number) which output an IF signal, to a conversion table 26. The conversion table 26 designates the reference voltage which corresponds to the transmission wave number to the reference value generator 27, and the reference value generator 27 generates the designated reference voltage. The comparator 28 outputs the difference between the voltage detected by the detector 25 and the reference voltage, and the variable attenuator 13 controls the attenuation so that the difference becomes zero.

According to the second method, since the power is controlled by feed backing the result of detection of the actual transmission power, it is not particularly necessary to take the ambience of the transmission apparatus into consideration.

However, in order to detect the actual transmission power, it is necessary to continuously output transmission signals from the power amplifier 15 for the period of time which is necessary for the detection, and the transmission wave number must be invariable during that time. On the other hand, each channel unit which constitutes the earth station outputs an IF signal only while sound is detected in accordance with a voice activation system and, in addition, the number of channel units which transmit a signal varies dynamically. For this reason, according to the second method, the supply of transmission signals is sometimes intermitted, or when the transmission wave number changes, the correct measurement of the transmission power and, hence, accurate level control is impossible.

In a TDMA system or the like for transmitting a short burst signal by time-division multiplex, since the time allotted for the detection of the transmission power is very short, it is difficult for the detector to detect the transmission power with accuracy in accordance with the second method. It takes about 3 seconds to detect the power by a simple detector, but since a burst signal is as short as about several hundred msec, it is difficult to measure the transmission power with accuracy. A burst signal used in a DAMA-SCPC (demand assign multi access-signal channel per carrier) system is very short. It is necessary to control the transmission power so as to be stable even in a system using such a short burst signal.

In order to cope with a change in the transmission wave number and a short burst signal, use of a high-speed detector may be considered, but it involves various problems both in technique and in the cost and, in addition, since the conversion table which corresponds to a short burst signal requires a complicated circuit, which makes the realization of a high-speed detector difficult.

SUMMARY OF THE INVENTION

Accordingly, it is a first object of the present invention to eliminate the above-described problems in the related art and to provide a transmission power control apparatus which is capable of detecting a transmission power with accuracy by a simple structure even if a transmission wave number varies or a short burst signal is transmitted, thereby controlling the transmission power so as to have a preset level even if the ambience (ambient temperature or the like) of the apparatus varies.

It is a second object of the present invention to provide a transmission power control apparatus which is capable of accurately controlling the level of the transmission power so as to have a preset level by a simple structure even if a transmission apparatus is separated into an indoor unit and an outdoor unit.

To achieve the first object, in a first aspect of the present invention, there is provided a transmission power control apparatus comprising: a plurality of channel units for outputting IF signals; a synthesizer for synthesizing the IF signals output from the channel units; a level controller such as an attenuator or a gain-variable amplifier for making the level of the synthesized signal variable; a frequency converter for converting the frequency of the synthesized signal into the frequency of an RF signal; a power amplifier for amplifying the power of the RF signal; a detector for detecting the output level of the power amplifier; a reference voltage generator; a controller; a comparator; a dummy antenna having the same impedance characteristic as an antenna; and a change-over switch, wherein, when none of the channel units transmit an IF signal, the controller controls the change-over switch so as to connect the output of the power amplifier to the dummy antenna, instructs m channel units to transmit IF signals for a predetermined time and instructs the reference voltage generator to generate the reference voltage corresponding to the transmission wave number m, the comparator outputs the difference between the detected voltage and the reference voltage, and the level controller controls the attenuation or the gain so that the difference becomes zero.

To achieve the first object, in a second aspect of the present invention, there is provided a transmission power control apparatus comprising: a plurality of channel units for outputting IF signals; a synthesizer for synthesizing the IF signals output from the channel units; a level controller such as an attenuator or a gain-variable amplifier for making the level of the synthesized signal variable; a frequency converter for converting the frequency of the synthesized signal into the frequency of an RF signal; a power amplifier for amplifying the power of the RF signal; a detector for detecting the output level of the power amplifier; a reference voltage generator; a controller; and a comparator, wherein, when none of the channel units transmit an IF signal, the controller instructs a predetermined channel unit to transmit an IF signal for controlling the transmission power and instructs the reference voltage generator to generate a reference voltage and, when the IF signal is output, the comparator outputs the difference between the detected voltage and the reference voltage, and the level controller controls the attenuation or the gain so that the difference becomes zero.

To achieve the second object, in a third aspect of the present invention, there is provided a transmission power control apparatus comprising: an indoor unit; and an outdoor unit; the indoor unit including: a plurality of channel units; a synthesizer for synthesizing the IF signals output from the channel units; a frequency converter for converting the frequency of the synthesized signal so as to transmit the synthesized signal to the outdoor unit; a level controller such as an attenuator or a gain-variable amplifier for making the level of the signal output from the frequency converter variable; an amplifier; a detector for detecting the output level of the amplifier; a reference voltage generator for outputting the reference voltage corresponding to a transmission wave number m; a controller; a comparator; a dummy load provided with the same input impedance characteristic as the outdoor unit; and a change-over switch, wherein, when none of the channel units transmit an IF signal, the controller controls the change-over switch so as to connect the output of the amplifier to the dummy load, instructs a predetermined number m of channel units to transmit IF signals for a predetermined time and instructs the reference voltage generator to generate the reference voltage corresponding to the transmission wave number m, the comparator outputs the difference between the detected voltage and the reference voltage, and the level controller controls the attenuation or the gain so that the difference becomes zero; and the outdoor unit including: a frequency converter for converting the frequency of the signal transmitted from the indoor unit into the frequency of an RF signal and outputting the RF signal; a level controller such as an attenuator or a gain-variable amplifier for making the level of the RF signal output from the frequency converter variable; a temperature compensator for inputting an output power correction signal corresponding to the temperature of the interior of the outdoor unit to the level controller; and a power amplifier for amplifying the signal output from the level controller and inputting the amplified signal to an antenna; wherein the level controller controls the attenuation or the gain on the basis of the output power correction signal.

To achieve the second object, in a fourth aspect of the present invention, there is provided a transmission power control apparatus comprising: an indoor unit; and an outdoor unit; the indoor unit including: a plurality of channel units; a synthesizer for synthesizing the IF signals output from the channel units; a frequency converter for converting the frequency of the synthesized signal so as to transmit the synthesized signal to the outdoor unit; a level controller such as an attenuator or a gain-variable amplifier for making the level of the signal output from the frequency converter variable; an amplifier; a detector for detecting the output level of the amplifier; a reference voltage generator; a controller; and a comparator, wherein, when none of the channel units transmit an IF signal, the controller instructs a predetermined channel unit to transmit IF signals for controlling the transmission power and, when the IF signal is output, the comparator outputs the difference between the detected voltage and the reference voltage, and the level controller controls the level so that the difference becomes zero, and the outdoor unit including: a frequency converter for converting the frequency of the signal transmitted from the indoor unit into the frequency of an RF signal and outputting the RF signal; a level controller such as an attenuator or a gain-variable amplifier for making the level of the RF signal output from the frequency converter variable; a temperature compensator for inputting an output power correction signal corresponding to the temperature of the interior of the outdoor unit to the level controller; and a power amplifier for amplifying the signal output from the level controller and inputting the amplified signal to an antenna; wherein the level controller controls the attenuation or the gain on the basis of the output power correction signal.

Other features and advantages of the present invention will be apparent from the following description taken in conjunction with the accompanying drawings.

BRIEF DESCRIPTION OF THE DRAWINGS

FIG. 2 is an explanatory view of the contents of the stored conversion table;

FIG. 15 shows the structure of an earth station provided with a transmission power control function.

DESCRIPTION OF THE PREFERRED EMBODIMENTS (A) First Embodiment
(a) Structure

Figure 1:
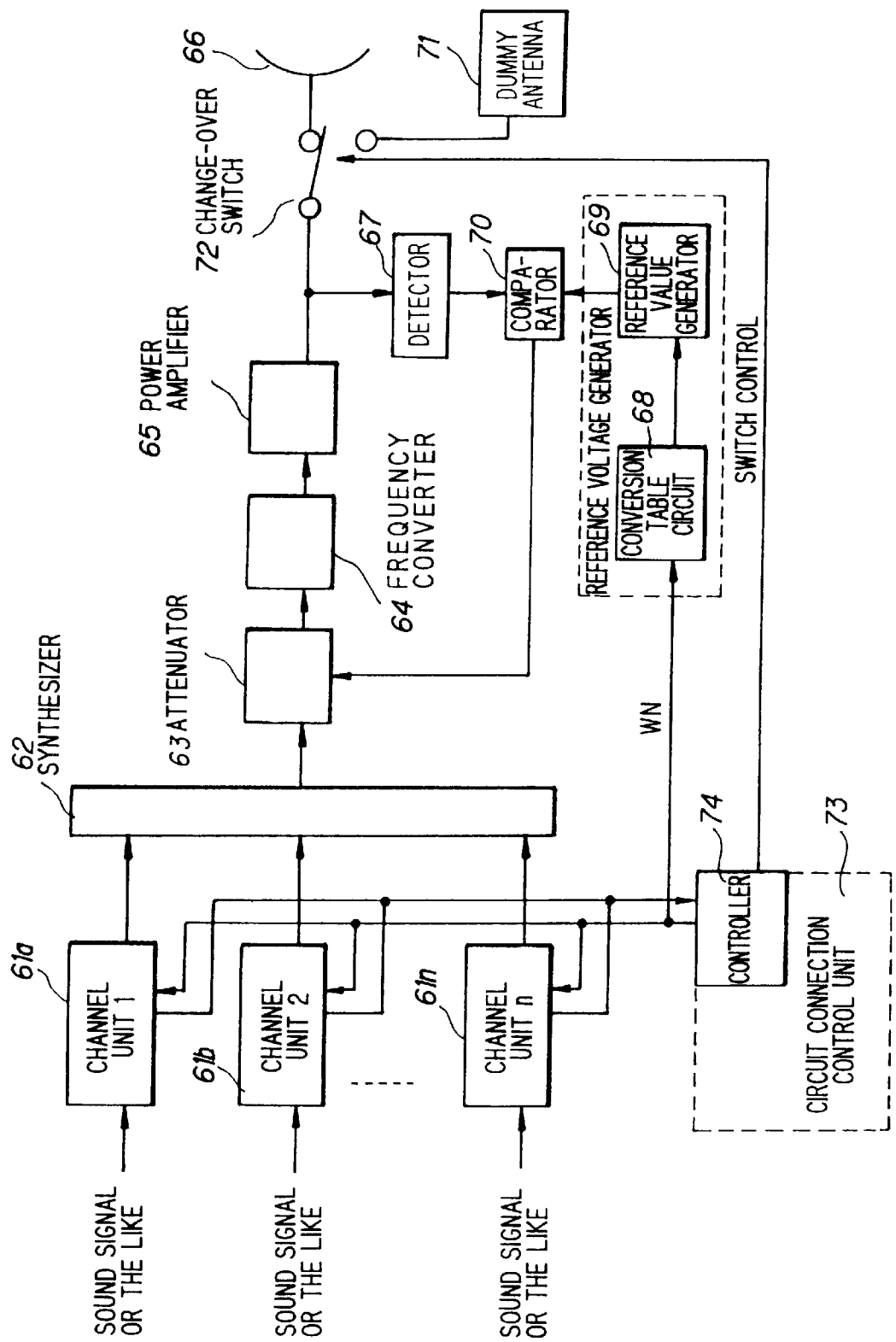
FIG. 1 shows the structure of a first embodiment of the present invention.

FIG. 1 shows the structure of an earth station provided with a transmission power control function in a first embodiment of a transmission power control apparatus according to the present invention. In FIG. 1, only the transmission system is shown, the reception system being omitted.

Figure 2:
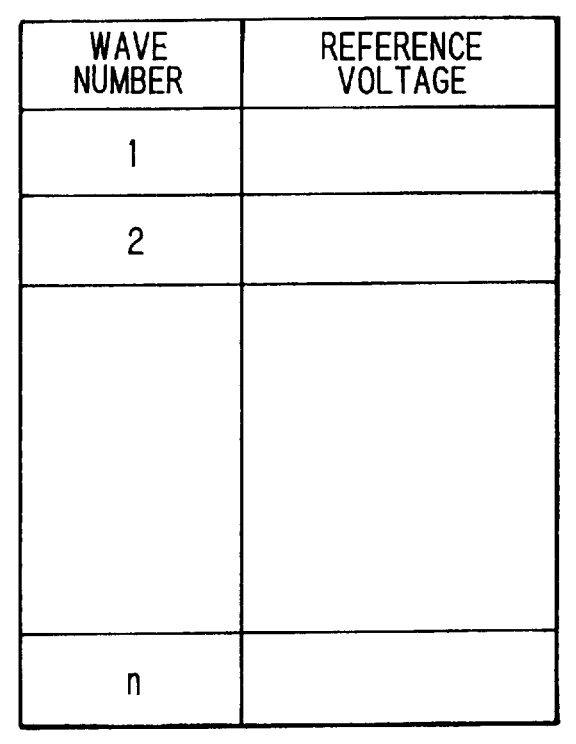

The reference numerals 61a to 61n denote channel units. Each of the channel units 61a to 61n is connected to an exchange, and outputs an IF signal obtained by modulating a communication channel frequency signal with a baseband signal such as a sound signal input from the exchange and outputs a demodulated sound signal which is obtained from a reception signal by demodulating, to the exchange. The reference numeral 62 represents a synthesizer for synthesizing the IF signals obtained by modulation in the respective units 61a to 61n, 63 a level controller such as an attenuator or a gain-variable amplifier (hereinafter only an attenuator will be explained) which makes the level of the synthesized signal variable, 64 an frequency converter for converting the frequency of the synthesized signal into an RF frequency, 65 a power amplifier for amplifying the output of the RF signal output from the frequency converter 64 to a required output, 66 an antenna, and 67 a detector for detecting the output level of the power amplifier 65. The reference numeral 68 denotes a conversion table circuit for storing the correspondence between a transmission wave number and a reference voltage level, as shown in FIG. 2, and 69 a reference value generator for outputting the reference voltage having an amplitude which corresponds to a transmission wave number. The conversion table circuit 68 and the reference value generator 69 constitute a reference voltage generator.

Figure 3:
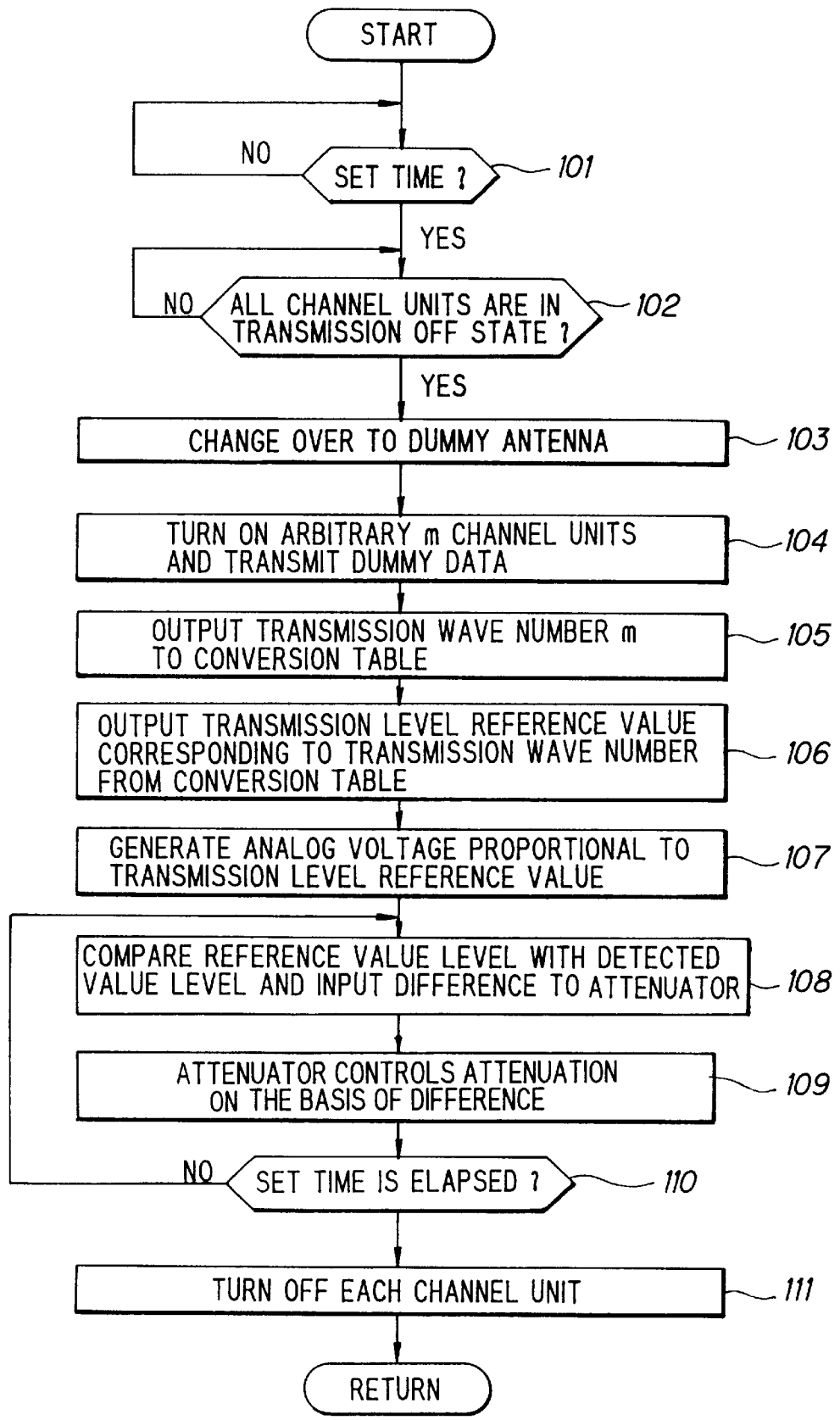
FIG. 3 is a flow chart of the transmission power control in the first embodiment.

The reference numeral 70 represents a comparator for outputting the difference between the voltage detected by the detector 67 and the reference voltage output from the reference voltage generator, 71 a dummy antenna having the same impedance characteristic as the antenna 66, 72 a change-over switch for inputting the RF signal output from the power amplifier 65 to the antenna 66 or the dummy antenna 71, 73 a circuit connection control unit, 74 a controller provided in the circuit connection control unit 73. The controller 74 (1) allows or inhibits each of the channel units 61a to 61n output the IF signal, (2) supplies the transmission wave number WN to the conversion table circuit 68, and (3) controls the change-over of the switch 72.
(b) Summary of Transmission Power Control When none of the channel units 61a to 61n transmit an IF signal, the controller 74 controls the change-over switch 72 so as to connect the output of the power amplifier 65 to the dummy antenna 71, instructs a predetermined number m (m is an integer of not less than 1) of channel units to output IF signals, inputs m to the conversion table circuit 68 as a transmission wave number, and instructs the reference value generator 69 to generate a reference voltage. The comparator 70 outputs the difference between the detected voltage and the reference voltage, and the attenuator 63 controls the attenuation so that the difference becomes zero.
(c) Detailed Explanation of Transmission Power Control FIG. 3 is a flowchart of the transmission power control in the first embodiment.

When a preset time specified by transmission power control period T1 or transmission power control time or the like which is set in a timer portion (not shown) comes (step 101), the controller 74 confirms the current status of all the channel units 61a to 61n (step 102). If any channel unit is in progress of the transmission, the controller 74 waits until the transmission operation is finished. When all the channels finish transmission, the controller 74 controls the change-over switch 72 so as to change the connection of the power amplifier 65 from the antenna 66 to the dummy antenna 71 and to supply the output of the power amplifier 65 to the dummy antenna 71 in order to initiate transmission power control (step 103). The controller 74 then allows arbitrary m channel units so as to output IF signals based on dummy data (step 104), and outputs m to the conversion table circuit 68 as a transmission wave number (step 105).

When the transmission wave number m is input to the conversion table circuit 68, it outputs the transmission level reference value which corresponds to the transmission wave number m (step 106), and the reference value generator 69 inputs the reference voltage which corresponds to the transmission level reference value to the comparator 70 (step 107).

The detector 67 detects the output level of the power amplifier 65 and inputs it to the comparator 70. The comparator 70 outputs the difference between the detected voltage and the reference voltage to the attenuator 63 (step 108), and the attenuator 63 adjusts the output level by controlling the attenuation on the basis of the difference (step 109). Owing to this operation, the difference between the detected voltage and the reference voltage is reduced.

The controller 74 monitors whether or not the time elapsed since the start of the transmission power control has reached the preset time (step 110), and if the answer is in the negative, the control at the steps 108 and thereafter is repeated. As a result, the detected voltage becomes equal to the reference voltage.

If the time elapsed has reached the preset time, the controller 74 turns off the m channel units which have been turned on for the sake of transmission power control, and controls the change-over switch 72 so as to switch the connection of the power amplifier 65 from the dummy antenna 71 over to the antenna 66 and to supply the output of the power amplifier 65 to the antenna 66 (step 111), and finishes the transmission power control.

As described above, when all the channel units assume a non-transmission state, m channel units are turned on for a predetermined time so as to control the transmission power. It is therefore possible to detect the transmission power and control the attenuation of the attenuator so as to obtain a predetermined output with certainty even if a short burst signal is transmitted in a TDMA system or the transmission wave number changes in the actual communication. In addition, accurate transmission power control is enabled by a simple structure by adding the dummy antenna 71 and the change-over switch 72 even if the ambience such as the ambient temperature changes.

Although the attenuator is used as the level controller in FIG. 1, it is possible to provide a gain-variable amplifier and control the gain so that the detected voltage is equal to the reference voltage.

(B) Second Embodiment
(a) Summary

In the first embodiment, the power amplifier is connected to the dummy antenna which has the same input impedance as the antenna at the time of transmission power control so as to consume the power, and the attenuation of the attenuator is controlled so that the transmission power is equal to the preset power. However, it is also possible not to use the dummy antenna. In this case, only one channel unit is turned on so as to enable transmission at the time of transmission power control, and an IF signal having a frequency of a vacant channel (channel for transmission power control) which is permitted in the system is output from the channel unit. The IF signal is amplified by the power amplifier and emitted from the antenna, and the attenuation of the attenuator is controlled so that the transmission power is equal to the preset power.

(b) Structure

Figure 4:
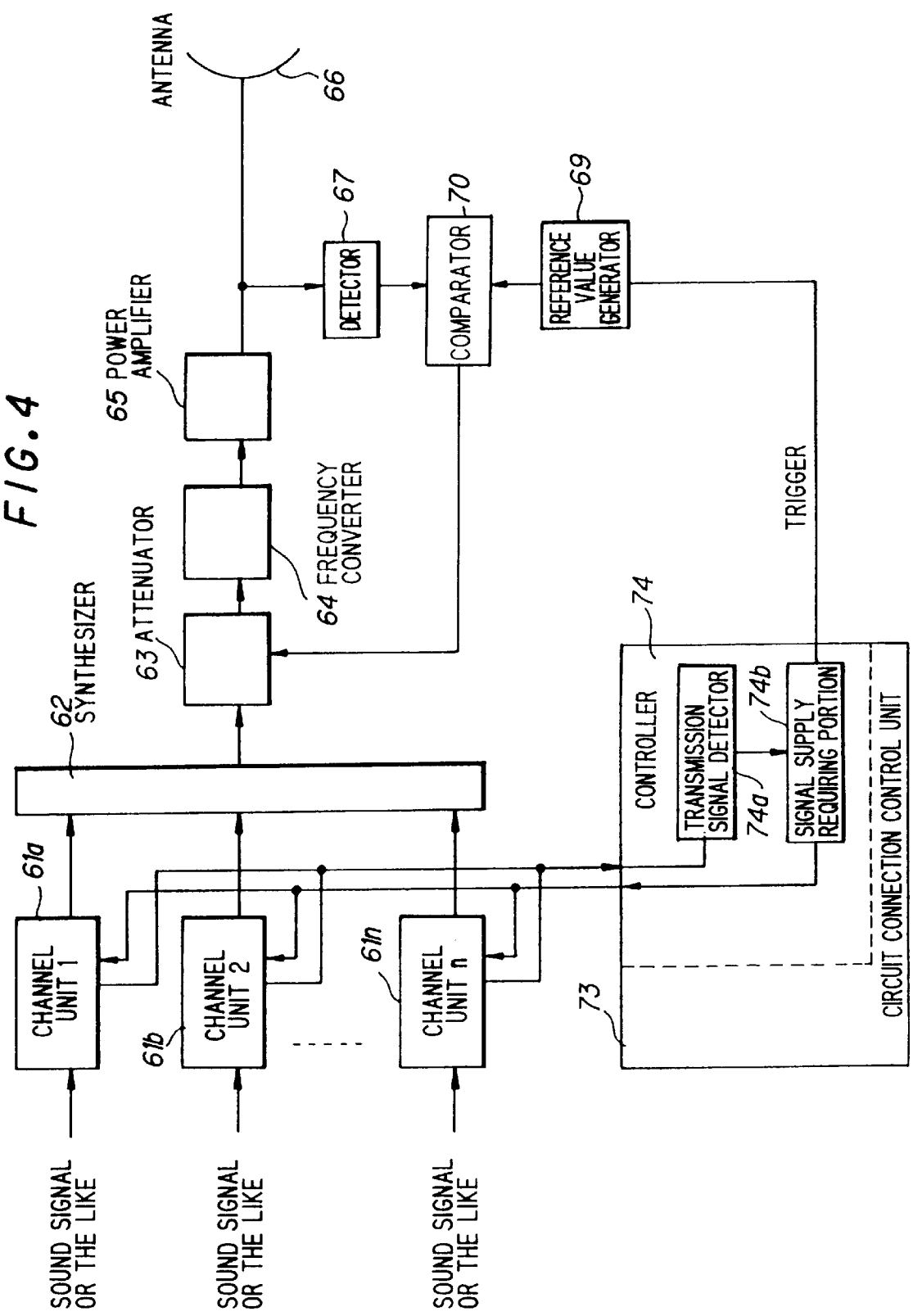
FIG. 4 shows the structure of a second embodiment of the present invention.

FIG. 4 shows the structure of an earth station provided with a transmission power control function in a second embodiment of a transmission power control apparatus according to the present invention. In FIG. 4, only the transmission system is shown, the reception system being omitted. The same reference numerals are provided for the elements which are the same as those in the first embodiment shown in FIG. 1.

The second embodiment is different from the first embodiment in that (1) the dummy antenna, the change-over switch, and the conversion table circuit are eliminated, (2) only one channel unit (e.g., the channel unit 61a) is turned on so as to enable transmission at the time of transmission power control, and an IF signal having a frequency of a vacant channel (channel for transmission power control) which is permitted in the system is output from the channel unit, (3) the reference value generator 69 outputs the reference voltage which corresponds to the transmission wave number m=1 at the time of transmission power control, (4) a transmission signal detector 74a is provided in the controller 74 so as to detect the end of transmission in each channel unit, and (5) a signal supply requesting portion 74b is provided in the controller 74 so as to instruct a predetermined channel unit (the channel unit 61a) to supply an IF signal through the channel for transmission power control and the reference value generator 69 to generate a reference voltage at the time of transmission power control. The channel for transmission power control is a channel which is never used as a communication channel or a control channel. In other words, it is a vacant channel which is used only for transmission power control, and a predetermined frequency is allotted thereto.

(c) Transmission Power Control

Figure 5:
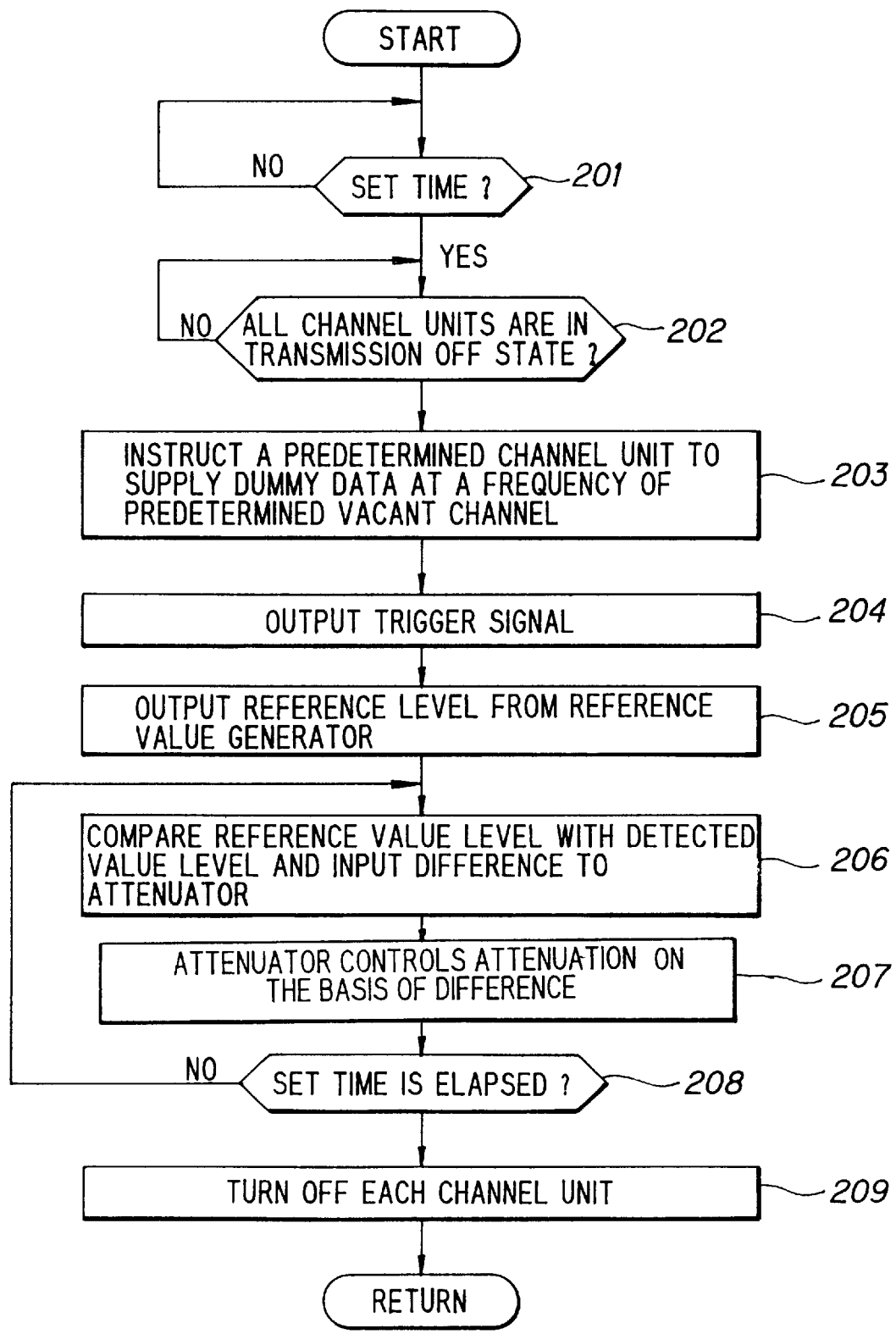
FIG. 5 is a flow chart of the transmission power control in the second embodiment.

FIG. 5 is a flowchart of the transmission power control in the second embodiment.

When a preset time specified by transmission power control period T1 or transmission power control time or the like which is set in a timer portion (not shown) comes (step 201), the controller 74 confirms the current status of all the channel units 61a to 61n (step 202). If any channel unit is in progress of the transmission, the controller 74 waits until the transmission operation is finished. When all the channels finish transmission, the controller 74 instructs a predetermined channel unit (e.g., channel unit 61a) to supply dummy data through the channel for transmission power control (compulsory signal supply command, step 203) in order to start transmission power control. The controller 74 inputs a trigger signal to the reference value generator 69 (step 204).

When the trigger signal is input, the reference value generator 69 outputs the reference voltage which corresponds to the transmission wave number 1 to the comparator 70 (step 205). The detector 67 detects the output level of the power amplifier 65 and inputs it to the comparator 70.

The comparator 70 outputs the difference between the detected voltage and the reference voltage to the attenuator 63 (step 206), and the attenuator 63 adjusts the output level by controlling the attenuation on the basis of the difference (step 207). Owing to this operation, the difference between the detected voltage and the reference voltage is reduced.

The controller 74 monitors whether or not the time elapsed since the start of the transmission power control has reached the preset time (step 208), and if the answer is in the negative, the control at the steps 206 and thereafter is repeated. As a result, the detected voltage becomes equal to the reference voltage.

If the time elapsed has reached the preset time, the controller 74 turns off the channel units 61a which has turned on for the sake of transmission power control (step 209), thereby ending the transmission power control.

As described above, when all the channel units assume a non-transmission state, a predetermined channel unit is turned on for a predetermined time so as to supply an IF signal through the channel for transmission power control for the purpose of transmission power control. It is therefore possible to control the attenuation of the attenuator so as to obtain a predetermined output with certainty even if a short burst signal is transmitted in a TDMA system or the transmission wave number changes in the actual communication. In addition, since the dummy antenna, the change-over switch and the conversion table circuit in the first embodiment are obviated, accurate transmission power control is enabled by a simple structure even if the ambience such as the ambient temperature changes.

(d) Modifications (d-1) First modification

Although the attenuator is used as the level controller in the above explanation, it is possible to provide a gain-variable amplifier and control the gain so that the detected voltage is equal to the reference voltage.

(d-2) Second modification

Although only one channel unit is turned on at the time of transmission power control in the above explanation, the number of channel units turned on may be generally m (integer of not less than 1). In this case, the reference voltage which corresponds to the transmission wave number m is output from the reference value generator.

(d-3) Third modification

Although transmission power control is executed after the controller 74 confirms the end of transmission of all the channel units in the above explanation, may be provided a control earth station which monitors the end of transmission of all the channel units constituting each earth station and which reports the transmission power control possible state to each earth station.

That is, in the system structure in which an earth station communicates with the earth station of the called party in accordance with the instruction of a control earth station, the control earth station can monitor that all the channel units of each earth station assume a non-transmission state. Therefore, when the control earth station detects that all the channel units of a predetermined earth station assume a non-transmission state, it informs the controller of the corresponding earth station of the transmission power control possible state through the control channel. The controller instructs a predetermined channel unit to output an IF signal for transmission power control in accordance with the information. In this manner, the structure of the controller may be simplified.

(C) Third Embodiment (a) Summary

In the first and second embodiments, all the earth stations are provided indoors. However, a recent earth station represented by a VSAT (very small aperture terminal) system gives priority to the facility of installment, and receiver and transmitter portions are inserted into a box body having a drip-proof structure as an outdoor unit, while a channel unit and the like are provided in an indoor unit.

In such a structure in which the earth station is separated into an outdoor unit and an indoor unit, it is necessary to control each unit so as to obtain a predetermined output with respect to a change in the ambience such as the ambient temperature. Accordingly, in a third embodiment, (1) in the indoor unit, the output of an amplifier is detected so as to compare the detected output with a reference revel and an attenuator executes necessary power control, and (2) in the outdoor unit, the amplification characteristic of a power amplifier with respect to a temperature change is obtained and a level correction value with respect to the temperature is determined on the basis of the amplification characteristic in advance, the actual ambient temperature during operation is detected by a temperature sensor and an attenuator or the like executes level control by using the level correction value with respect to the actual temperature.

(b) Structure

Figure 6:
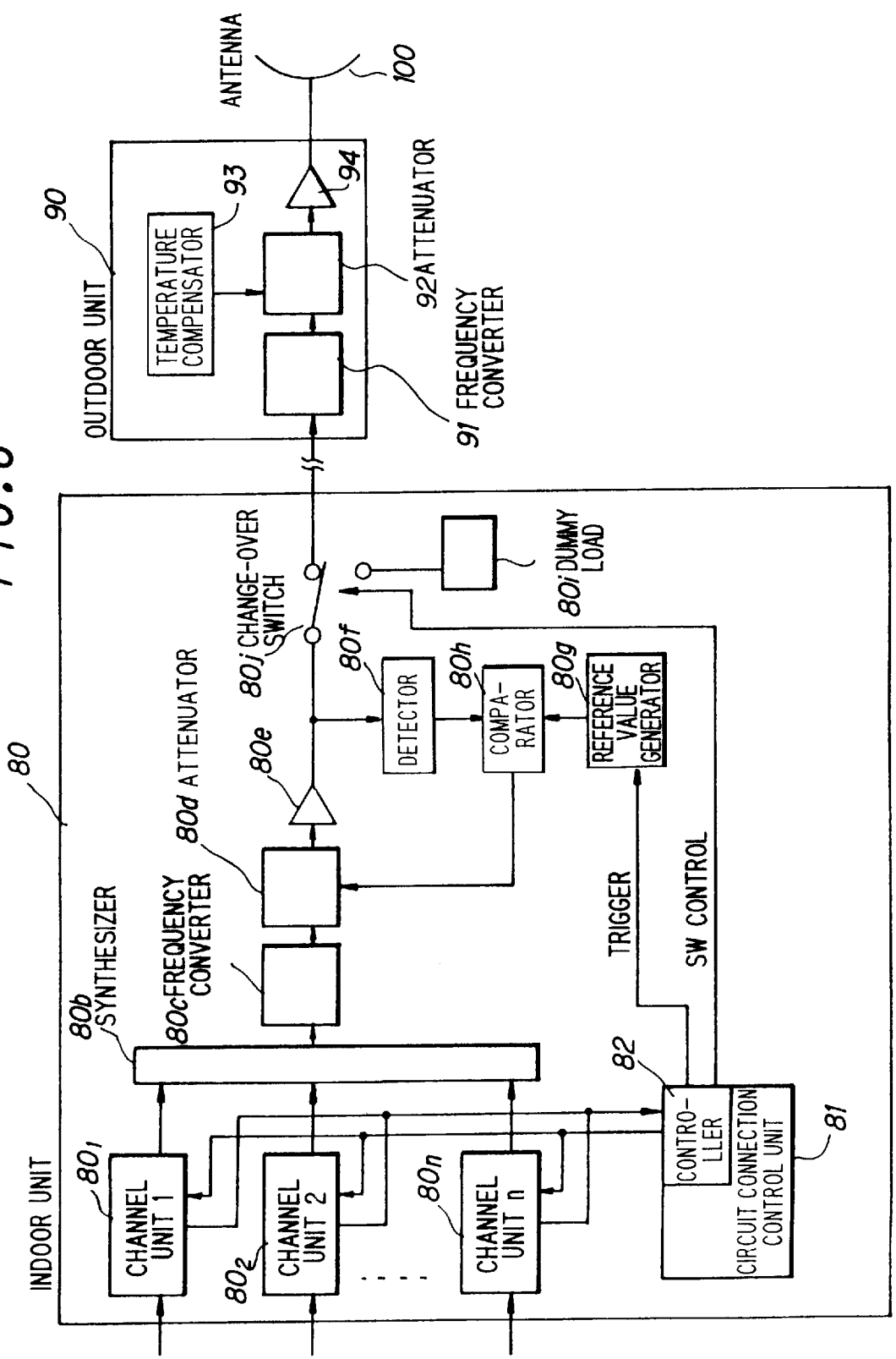
FIG. 6 shows the structure of a third embodiment of the present invention.

FIG. 6 shows the structure of an earth station provided with a transmission power control function as a third embodiment of the present invention, the earth station being separated into an outdoor unit and an indoor unit. The reference numeral 80 represents an indoor unit, 90 an outdoor unit and 100 an antenna.

The indoor unit 80 is composed of: a plurality of channel units $80_1$ to $80_n$ for outputting an IF signal which is obtained by modulating a carrier of a predetermined frequency with a baseband signal such as a sound signal; a synthesizer 80b for synthesizing the IF signals output from the respective channel units $80_1$ to $80_n$; a frequency converter 80c for converting the frequency of the synthesized signal into the frequency suitable for transmission to an outdoor unit; a level controller 80d such as an attenuator or a gain-variable amplifier (hereinafter only an attenuator will be explained) for making the level of the synthesized signal variable; an amplifier 80e for amplifying the output of the signal output from the attenuator 80d; a detector 80f for detecting the output level of the amplifier 80e; a reference voltage generator 80g for generating the reference voltage which corresponds to a transmission wave number m at the time of transmission power control; a comparator 80h for outputting the difference between the voltage detected by the detector 80f and the reference voltage output from the reference voltage generator 80g; 80i a dummy load having the same impedance characteristic as the outdoor unit 90; a change-over switch 80j for inputting the signal output from the amplifier 80e to the outdoor unit 90 or the dummy load 80i; and a circuit connection control unit 81. The circuit connection control unit 81 is provided with a controller 82 for (1) allowing or inhibiting each of the channel units $80_1$ to $80_n$ to output the IF signal, (2) instructing the reference voltage generator 80g to generate a reference voltage, and (3) controlling the change-over of the switch 80j.

The outdoor unit 90 is composed of: a frequency converter 91 for converting the frequency of the signal supplied from the indoor unit 80 into an RF frequency and outputting the RF signal; a level controller 92 such as an attenuator or a gain-variable amplifier (hereinafter only an attenuator will be explained) for making the level of the RF signal output from the frequency converter 91 variable; a temperature compensator 93 for inputting an output power correction signal corresponding to the temperature of the interior of the outdoor unit 90 to the attenuator 92; and a power amplifier 94 for amplifying the signal output from the attenuator 92 and inputting the amplified signal to the antenna 100.

(c) Transmission power control (c-1) Indoor unit

When a preset time specified by transmission power control period T1 or transmission power control time or the like comes, the controller 82 confirms the current status of all the channel units $80_1$ to $80_n$. If all the channel units assume a non-transmission state, the controller 82 controls the change-over switch 80j so as to change the connection of the amplifier 80e from the outdoor unit 90 to the dummy load 80i of the indoor unit 80 and to supply the output of the amplifier 80e to the dummy load 80i. The controller 82 then turns on a predetermined number m (m is an integer of not less than 1) of the channel units so as to output IF signals and inputs a trigger signal to the reference voltage generator 80g.

When the trigger signal is input, the reference voltage generator 80g outputs a reference voltage which corresponds to the transmission wave number m to the comparator 80h. The detector 80f detects the output level of the amplifier 80e and inputs the detected level to the comparator 80h. The comparator 80*h* outputs the difference between the detected voltage and the reference voltage to the attenuator 80*d* and the attenuator 80*d* controls the attenuation on the basis of the difference so as to adjust the output level. In this manner, the difference between the detected voltage and the reference voltage is reduced. The controller 82 monitors whether or not the time elapsed since the beginning of transmission power control has become the preset time, and if the answer is in the negative, the above-described feedback level control is continued until the detected voltage becomes equal to the reference voltage.

If the elapsed time is equal to the preset time, the controller 82 turns off the m channel units which have been turned on for the purpose of transmission power control and controls the change-over switch 80*j* so as to switch over the output of the amplifier 80*e* from the dummy load 80*i* to the output of the outdoor unit 90, thereby finishing transmission power control.

(c-2) Outdoor unit

Figure 7:
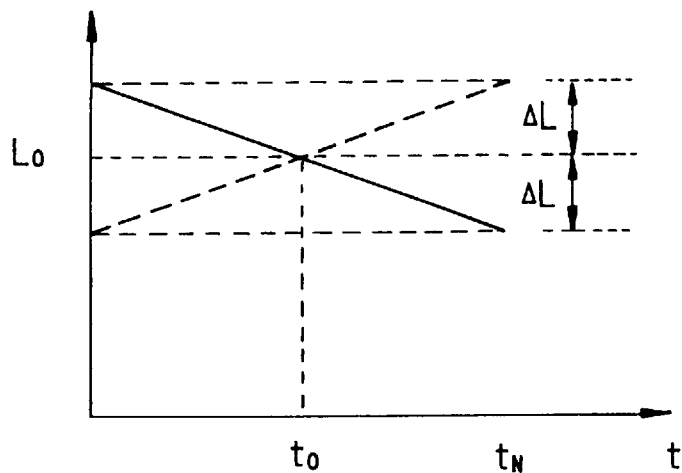
FIG. 7 is an explanatory view of the transmission power control by the outdoor unit in the third embodiment.

In the outdoor unit 90, the output power $L_0$ is output at an ordinary temperature $t_0$, as shown in FIG. 7, and the output level changes with temperature, as indicated by the solid line. When the outdoor unit 90 is provided with such a temperature characteristic, the attenuation of the attenuator 92 is controlled as indicated by the broken line in order to make the output power equal to constant value $L_0$ irrespective of the temperature.

The temperature compensator 93 stores the correspondence between the temperature and the attenuation in a temperature compensation table provided therein in advance, obtains the attenuation corresponding to the current ambient temperature from the table, and inputs it to the attenuator 92 so as to obtain a constant output $L_0$ irrespective of the temperature.

Figure 8:
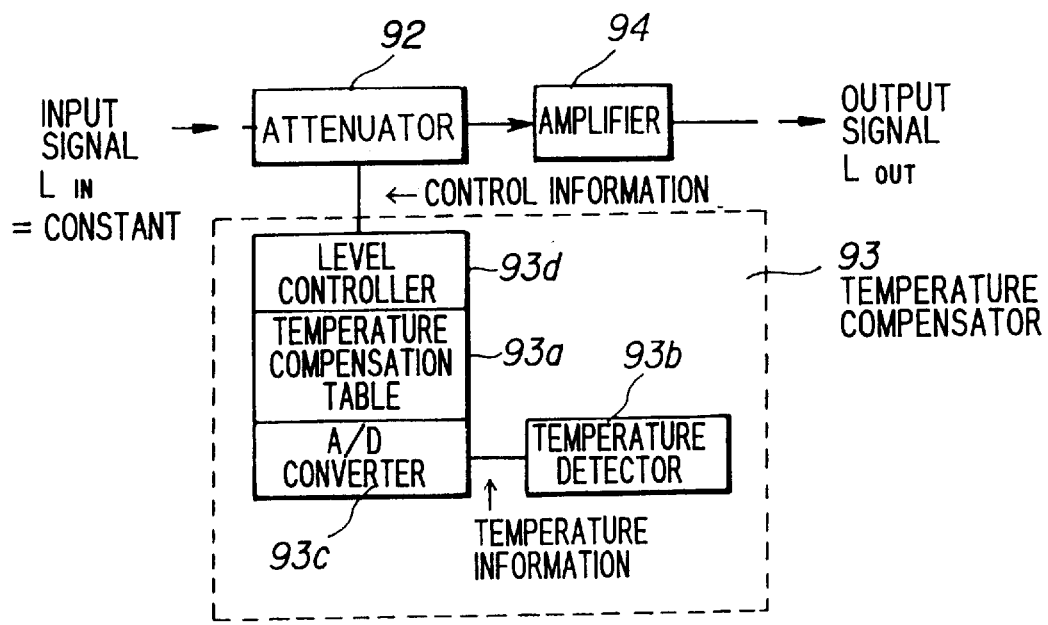
FIG. 8 shows the structure of the temperature compensator in the third embodiment.

FIG. 8 shows the structure of the temperature compensator 93. In FIG. 8, the reference numeral 93*a* represents a temperature compensation table, 93*b* a temperature detector, 93*c* an AD converter and 93*d* a level controller.

In this manner, even if the earth station is separated into an outdoor unit and an indoor unit, (1) since transmission power control is executed by the indoor unit by turning on the predetermined m channel units for a predetermined time so as to output an IF signal and consuming the transmission power by the dummy load after all the channel units stop transmission, it is possible to control the attenuation of the attenuator so as to obtain a predetermined output with certainty even if a short burst signal is transmitted in a TDMA system or the transmission wave number changes in the actual communication. In addition, (2) since the outdoor unit constantly executes transmission power control by the temperature compensation table, power control is possible which enables the preset power to be obtained as a whole even if the ambience such as the ambient temperature changes.

(d) Modification

In the third embodiment shown in FIG. 6, the attenuator 80*d* is provided at the next stage to the frequency converter 80*c* which is common to the channel units $80_1$ to $80_n$, but the attenuator 80*d* may be provided in the respective channel units. According to this structure, since it is possible to determine the attenuation of each attenuator for the corresponding channel unit, it is possible to control the transmission power to the preset value with high accuracy even if there is difference in the characteristics between channel units.

Figure 9:
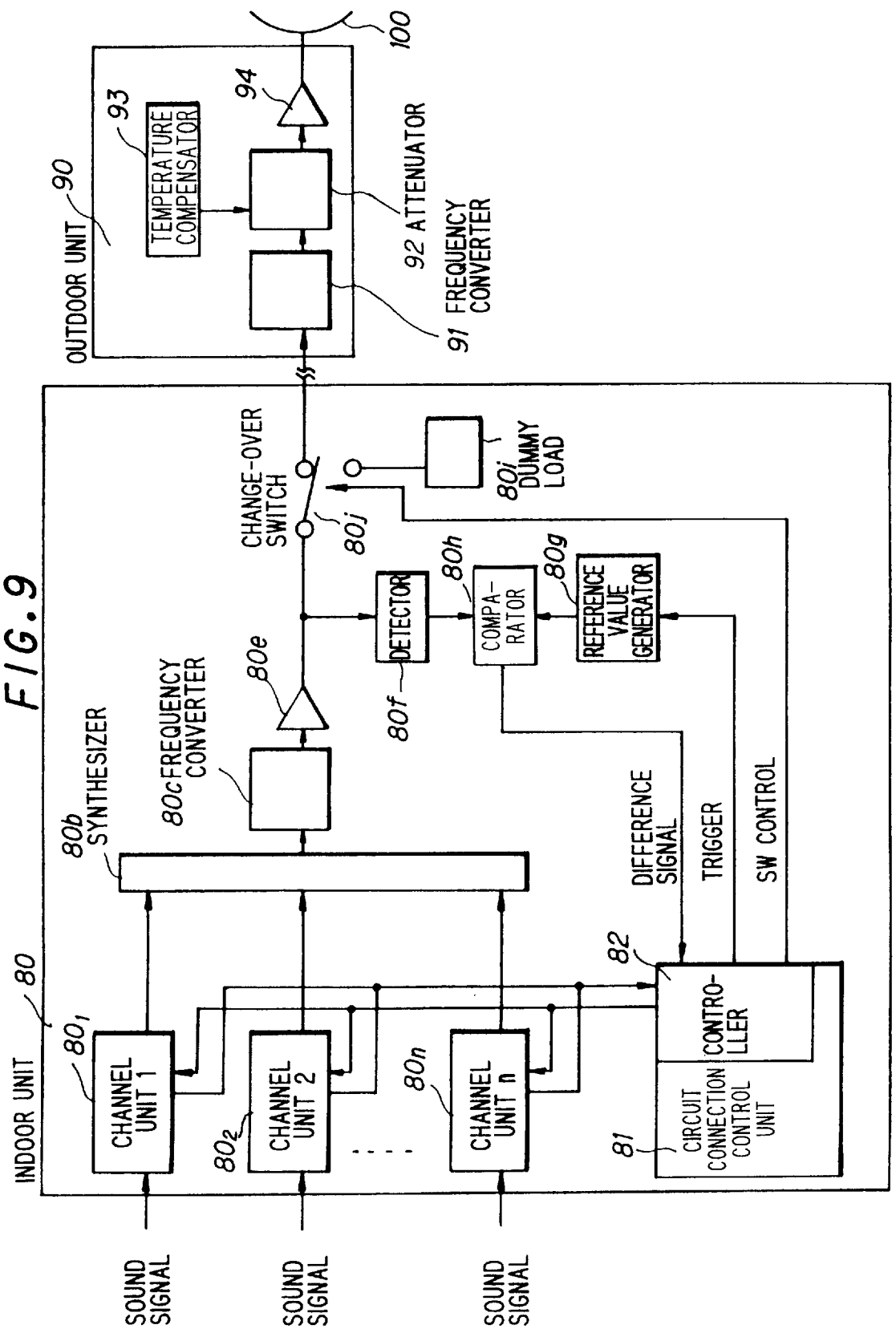
FIG. 9 is a modification of the third embodiment.
Figure 10:
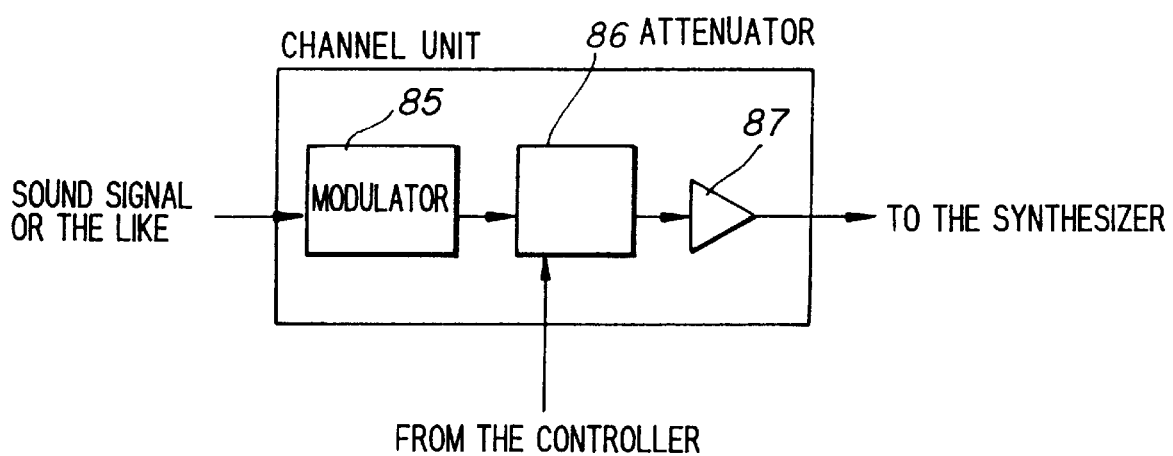
FIG. 10 shows the structure of a channel unit in the modification shown in FIG. 9.
Figure 14:
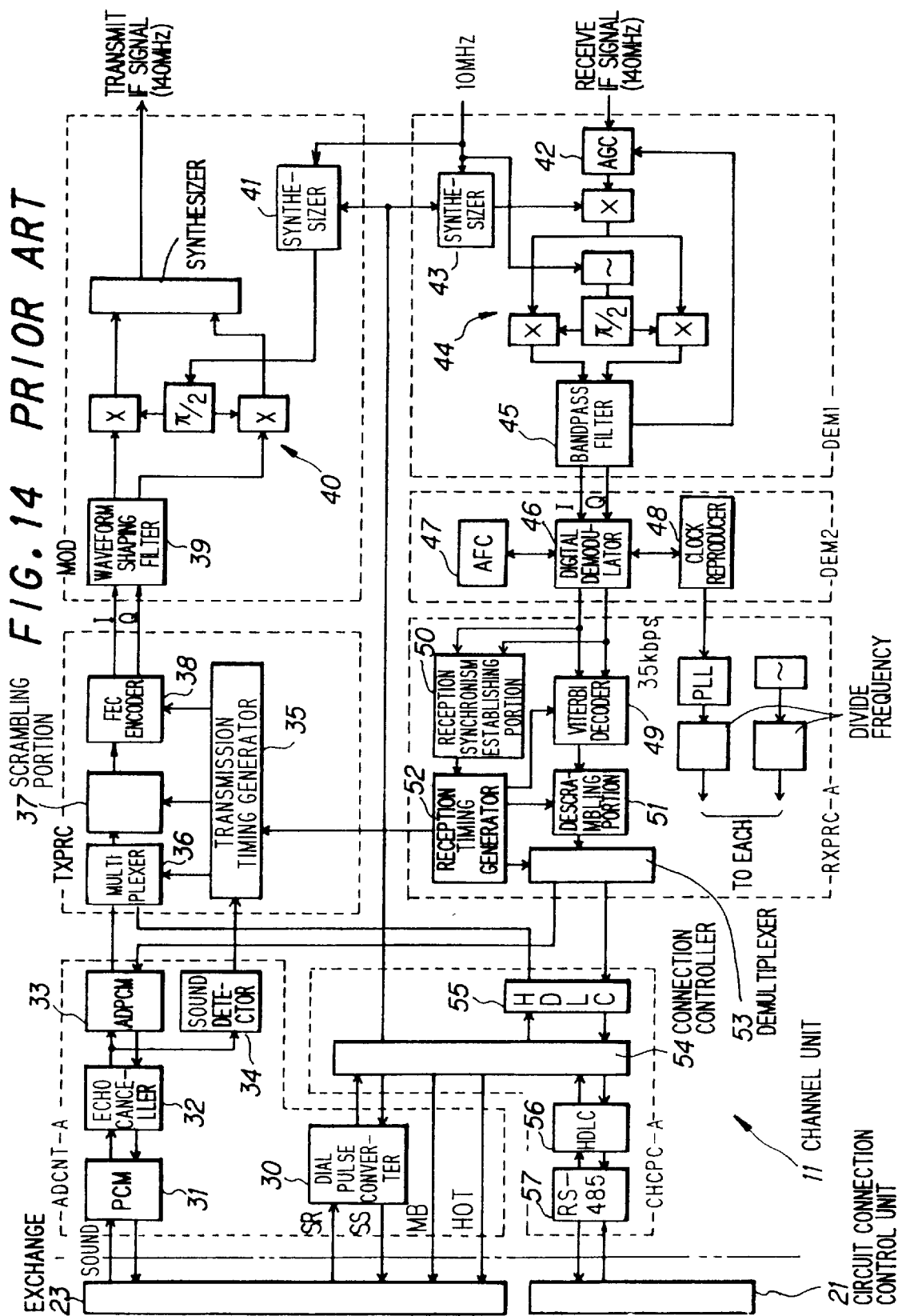
FIG. 14 shows the structure of a channel unit.

FIG. 9 shows the structure of a modification of the third embodiment in which the attenuator is provided in each channel unit, and FIG. 10 shows the structure of a channel unit shown in FIG. 9. The same reference numerals are provided for the elements which are the same as those shown in FIG. 6. The modification shown in FIG. 9 is different from the third embodiment shown in FIG. 6 in that (1) the attenuator is provided in each channel unit, and (2) the difference output from the comparator 80*h* is input to the attenuator in the channel unit through the controller 82. In FIG. 10, the reference numeral 85 denotes a modulator having the structure shown in FIG. 14, 86 an attenuator and 87 an amplifier for amplifying the output signal of the attenuator and inputting it to the synthesizer 80*b*.

At the time of transmission power control, when a preset time specified transmission power control period T1 or transmission power control time or the like comes, the controller 82 confirms the current status of all the channel units $80_1$ to $80_n$. If all the channel units assume a non-transmission state, the controller 82 controls the change-over switch 80*j* so as to change the connection of the amplifier 80*e* from the outdoor unit 90 over to the dummy load 80*i* of the indoor unit 80 and to supply the output of the amplifier 80*e* to the dummy load 80*i*. The controller 82 then turns on the first channel unit $80_1$ so as to output an IF signal and inputs a trigger signal to the reference voltage generator 80*g*.

When the trigger signal is input, the reference voltage generator 80*g* outputs a reference voltage which corresponds to the transmission wave number m=1 to the comparator 80*h*. The detector 80*f* detects the output level of the amplifier 80*e* and inputs the detected level to the comparator 80*h*. The comparator 80*h* outputs the difference between the detected voltage and the reference voltage to the controller 82, and the controller 82 inputs the difference to the attenuator 86 (FIG. 10) of the channel unit $80_1$. The attenuator 86 controls the attenuation on the basis of the difference so as to adjust the output level. In this manner, the difference between the detected voltage and the reference voltage is reduced. The controller 82 monitors whether or not the time elapsed since the beginning of transmission power control has become the preset time, and if the answer is in the negative, the above-described feedback level control is continued until the detected voltage becomes equal to the reference voltage.

If the elapsed time is equal to the preset time, the controller 82 turns off the channel unit $80_1$ which has been turned on for the purpose of transmission power control and controls the change-over switch 80*j* so as to switch over the output of the amplifier 80*e* from the dummy load 80*i* to the output of the outdoor unit 90, thereby finishing transmission power control.

Thereafter, the controller 82 controls the attenuation of the attenuator of each channel unit $80_2$–$80_n$ by serially switching the channel unit which is turned on over to another.

As described above, since an attenuator is provided in each channel unit and the attenuation is controlled so that the output level of the corresponding attenuator becomes a preset level, accurate transmission control is enabled even if there is a difference in the characteristic between channel units.

(D) Fourth Embodiment (a) Summary

In the third embodiment, the indoor unit 80 is provided with the dummy load 80*i* which has the same impedance characteristic as the outdoor unit 90 so that the amplifier 80*e* is connected to the dummy load 80*i* so as to consume the power at the time of transmission power control, and the attenuation of the attenuator 80*d* is so controlled that the transmission power is equal to the preset power. However, a transmission power control apparatus may have the following structure. No dummy load is used, only one channel is turned on at the time of transmission power control, and an IF signal having the frequency of a vacant channel (channel for transmission power control) which is permitted in the system is output from the channel unit. The IF signal is amplified by the amplifier and supplied to the outdoor unit, and the attenuation of the attenuator is so controlled that the transmission power is equal to the preset power.

(b) Structure

Figure 11:
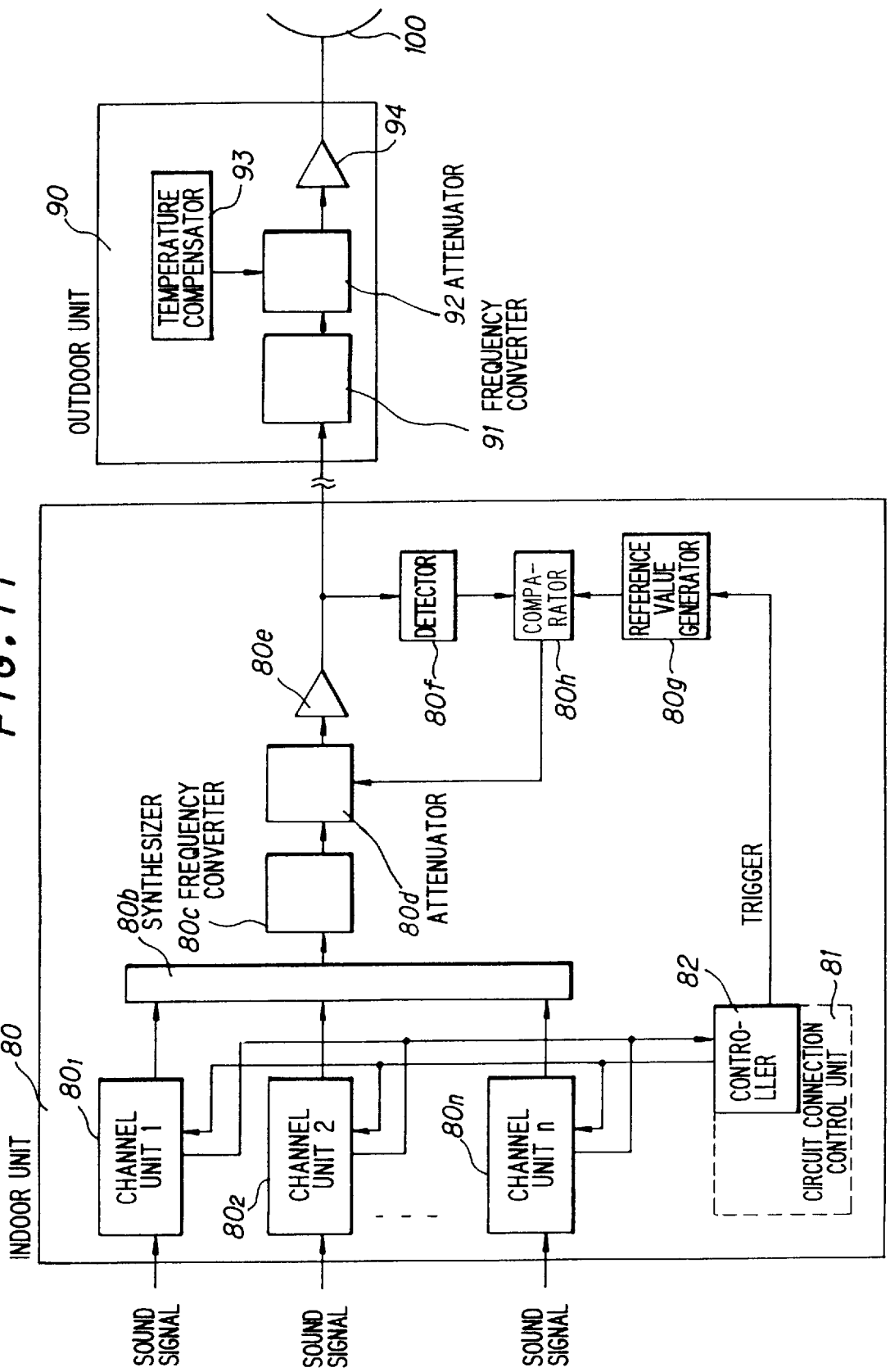
FIG. 11 shows the structure of a fourth embodiment of the present invention.
Figure 12:
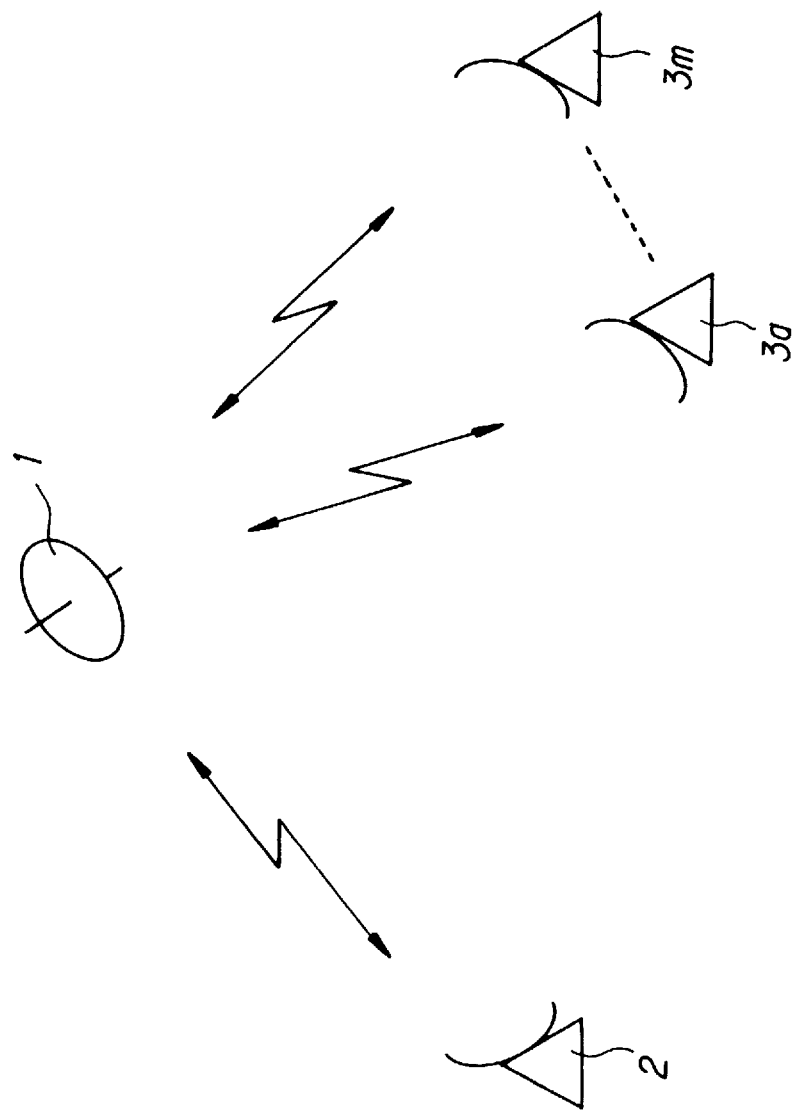
FIG. 12 shows the structure of a satellite communication system.
Figure 13:
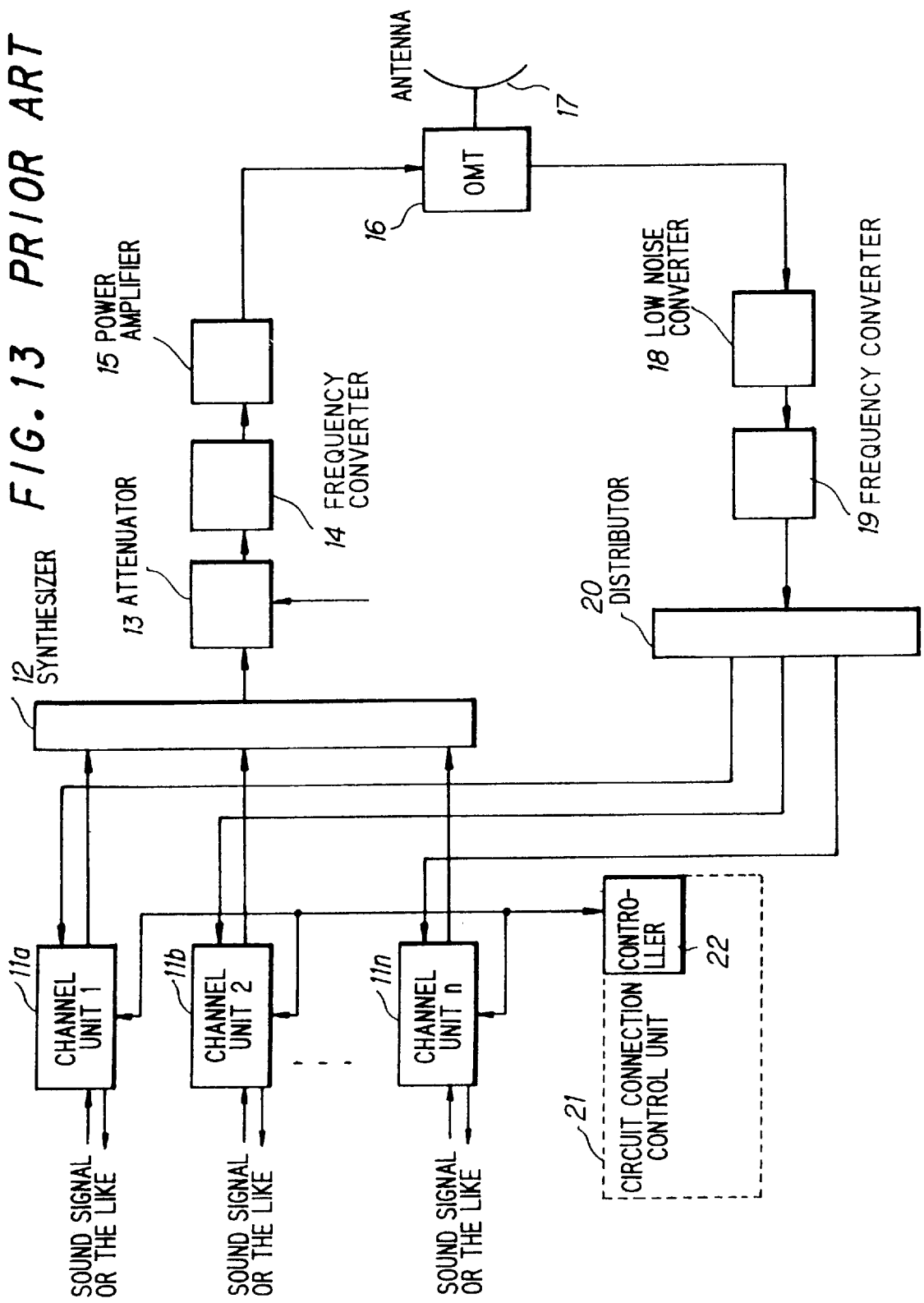
FIG. 13 shows the structure of an earth station.

FIG. 11 shows the structure of an earth station having such a structure as a fourth embodiment of the present invention. The same reference numerals are provided for the elements which are the same as those in the third embodiment shown in FIG. 6.

The fourth embodiment is different from the third embodiment shown in FIG. 6 in that (1) the dummy load and the change-over switch are removed, (2) only one channel unit (e.g., the channel unit $80_1$) is turned on at the time of transmission power control, and an IF signal having the frequency of a vacant channel (channel for transmission power control) which is permitted in the system is output from the channel unit $80_1$, and (3) the reference voltage generator 80g outputs the reference voltage which corresponds to the transmission wave number m=1 at the time of transmission power control. The channel for transmission power control is a channel which is not used as a communication channel or a control channel. In other words, it is a vacant channel which is used only at the time of transmission power control and a predetermined frequency is allotted thereto.

(c) Transmission power control by the indoor unit

When a preset time specified by transmission power control period T1 or transmission power control time or the like which is set in a timer portion (not shown) comes, the controller 82 confirms the current status of all the channel units $80_1$ to 80n. If all the channel units assume the non-transmission, the controller 82 instructs a predetermined channel unit (e.g., channel unit $80_1$) to transmit dummy data through the channel for transmission power control (compulsory signal supply command) in order to start transmission power control. The controller 82 inputs a trigger signal to the reference value generator 80g. When the trigger signal is input, the reference value generator 80g outputs the reference voltage which corresponds to the transmission wave number 1 to the comparator 80h. The detector 80f detects the output level of the amplifier 80e and inputs it to the comparator 80h.

The comparator 80h outputs the difference between the detected voltage and the reference voltage to the attenuator 80d, and the attenuator 80d adjusts the output level by controlling the attenuation on the basis of the difference. Owing to this operation, the difference between the detected voltage and the reference voltage is reduced.

The controller 82 monitors whether or not the time elapsed since the start of the transmission power control has reached the preset time, and if the answer is in the negative, the above-described feedback level control is continued until the detected voltage becomes equal to the reference voltage.

If the time elapsed has reached the preset time, the controller 82 turns off the channel unit 80i, thereby ending the transmission power control.

The outdoor unit 90 executes transmission power control in the same way as in the third embodiment.

As described above, when all the channel units stop transmission, since transmission power control is executed by the indoor unit by turning on a predetermined channel unit for a predetermined time so as to output an IF signal, it is possible to control the attenuation of the attenuator so as to obtain a predetermined output with certainty even if a short burst signal is transmitted in a TDMA system or the transmission wave number changes in the actual communication. In addition, since the dummy load or the change-over switch in the third embodiment is unnecessary, accurate power control is possible by a simple structure even if the ambience such as the ambient temperature changes.

In the above explanation, an attenuator is used as a level controller, but a gain-variable amplifier may be used instead.

As explained above, according to the present invention, when all the channel units stop transmission, the connection of the power amplifier is changed from the antenna over to the dummy antenna so as to supply the output of the power amplifier to the dummy antenna, a predetermined number m (m is an integer of not less than 1) of channel units are instructed to supply an IF signal, the reference voltage which corresponds to the transmission wave number m is generated, and an attenuator or a gain-variable amplifier controls the attenuation or the gain so that the difference in the detected voltage and the reference voltage is zero. It is therefore possible to control the level controller so as to obtain a predetermined output with certainty even if a short burst signal is transmitted in a TDMA system or the transmission wave number changes in the actual communication without any signal drop or any change in the transmission wave number at the time of transmission power control. In addition, according to the present invention, accurate power control is possible by a simple structure by adding a dummy load and a change-over switch even if the ambience such as the ambient temperature changes.

According to the present invention, when all the channel units assume a non-transmission state, a predetermined channel unit is turned on so as to supply an IF signal through the channel for transmission power control for the purpose of transmission power control. It is therefore possible to control the level controller so as to obtain a predetermined output with certainty even if a short burst signal is transmitted in a TDMA system or the transmission wave number changes in the actual communication without any signal drop or any change in the transmission wave number at the time of transmission power control. In addition, since the dummy antenna, the change-over switch and the conversion table circuit are obviated, accurate transmission power control is enabled by a simple structure even if the ambience such as the ambient temperature changes.

According to the present invention, since transmission power control is executed after the non-transmission state of all the channel units is confirmed at a preset period or time, transmission power control is possible without influencing the actual communication.

According to the present invention, when messages are exchanged with an earth station of a called party under instruction from the earth station as the controller, the earth station as the controller informs the control unit that transmission power control is possible when all the channel units assume a non-transmission state and the control unit executes transmission power control on the basis of the information. Thus, the load of the control unit is lightened.

According to the present invention, when an earth station is composed of an outdoor unit and an indoor unit, the indoor unit turns on a predetermined number m of channel units for a predetermined time so as to output IF signals and transmission power control is executed while consuming the transmission power by the dummy load after all the channel units assume a non-transmission state. The outdoor unit constantly executes transmission power control by using the temperature compensation table. It is therefore possible to obtain a predetermined output with certainty as a whole even if the ambience such as the ambient temperature changes. In addition, it is possible to control the level controller so as to obtain a predetermined output with certainty even if a short burst signal is transmitted in a TDMA system or the transmission wave number changes in the actual communication without any signal drop or any change in the transmission wave number at the time of transmission power control.

According to the present invention, when an earth station is composed of an outdoor unit and an indoor unit, the indoor unit turns on a predetermined channel unit for a predetermined time so as to output an IF signal through a channel unit for transmission power control and transmission power control is executed after all the channel units assume a non-transmission state. The outdoor unit constantly executes transmission power control by using the temperature compensation table. It is therefore possible to obtain a predetermined output with certainty as a whole even if the ambience such as the ambient temperature changes. In addition, it is possible to control the level controller so as to obtain a predetermined output with certainty even if a short burst signal is transmitted in a TDMA system or the transmission wave number changes in the actual communication without any signal drop or any change in the transmission wave number at the time of transmission power control.

Furthermore, according to the present invention, an attenuator is provided in each channel unit and the attenuation is so controlled that the output level of each attenuator becomes a preset level. Exact transmission power control is therefore possible even if there is a difference in the characteristic between channel units.

As many apparently widely different embodiments of the present invention can be made without departing from the spirit and scope thereof, it is to be understood that the invention is not limited to the specific embodiments thereof except as defined in the appended claims.

What is claimed is:

1. A transmission power control apparatus in a communication apparatus which is provided with a plurality of channel units each of which outputs an IF signal obtained by modulating a carrier of a predetermined frequency with a baseband signal, synthesizes the IF signal output from each channel unit, and emits the synthesized signal from an antenna, said transmission power control apparatus comprising:

a synthesizer for synthesizing said IF signals which are output from said plurality of channel units;

a level control circuit for controlling the level of the synthesized signal output from said synthesizer;

a frequency converter for converting the frequency of said synthesized signal into the frequency of an RF signal and outputting said RF signal;

a power amplifier for amplifying the power of said RF signal;

a detector for detecting the output level of said power amplifier;

a reference voltage generator for outputting a preset reference voltage;

a controller for instructing each of said channel units whether or not said channel unit should output an IF signal and instructing said reference voltage generator to generate said reference voltage;

a comparator for outputting the difference between the voltage detected by said detector and said reference voltage output from said reference voltage generator;

wherein, said communication apparatus constitutes an earth station which includes a plurality of channel units and a controller, for communicating with a called party through a communication satellite, and communicates to an earth station of said called party in accordance with the instruction from a control earth station, said control earth station informs said controller of said communication apparatus which constitutes a predetermined earth station that transmission power control is possible when none of said channel units of said communication apparatus transmit an IF signal;

said controller of said communication apparatus instructs a predetermined channel unit to output an IF signal for transmission power control; when said IF signal is transmitted, said comparator outputs the difference between the detected voltage and said reference voltage; and said level control circuit controls the level of said synthesized signal so that said difference output from said comparator becomes zero.

2. A transmission power control apparatus in a communication apparatus which is provided with a plurality of channel units each of which outputs IF signal obtained by modulating carrier of a predetermined frequency with a baseband signal, synthesizes the IF signal output from each channel unit, and emits the synthesized signal from an antenna, said transmission power control apparatus comprising:

an indoor unit; and an outdoor unit;

said indoor unit including:

a plurality of channel units;

a synthesizer for synthesizing the IF signals which are output from said plurality of channel units;

a frequency converter for converting the frequency of said synthesized signal so as to transmit said synthesized signal to said outdoor unit;

a level control circuit for controlling the level of the signal output from said frequency converter;

an amplifier for amplifying the output of said level control circuit;

a detector for detecting the output level of said amplifier;

a reference voltage generator for outputting the reference voltage which corresponds to a transmission wave number;

a controller for instructing each of said channel units whether or not said channel unit should output an IF signal and notifying said reference voltage generator of the transmission wave number;

a comparator for outputting the difference between the voltage detected by said detector and said reference voltage output from said reference voltage generator;

a dummy load having the same impedance characteristic as said outdoor unit; and a change-over switch for inputting the signal output from said amplifier to either of said outdoor unit and said dummy load;

wherein, when none of said channel units transmit an IF signal, said controller controls said change-over switch so as to connect the output of said power amplifier to said dummy load, instructs a predetermined number m (m is an integer of not less than 1) of channel units to output IF signals for a predetermined time and notifies said reference voltage generator of the number m as said transmission wave number;

said reference voltage generator outputs said reference voltage which corresponds to said transmission wave number;

said comparator outputs said difference between the detected voltage and said reference voltage; and said level control circuit controls the level of the signal output from said frequency converter so that said difference output from said comparator becomes zero; and said outdoor unit including:
 a frequency converter for converting the frequency of the signal transmitted from said indoor unit into the frequency of an RF signal and outputting said RF signal;
 a level control unit for controlling the level of said RF signal output from said frequency converter;
 a temperature compensator for inputting an output power correction signal corresponding to the temperature of the interior of said outdoor unit to said level control unit; and
 a power amplifier for amplifying the signal output from said level control unit and inputting the amplified signal to the antenna;
 wherein said level control unit controls the level of said RF signal on the basis of said output power correction signal.

3. A transmission power control apparatus in a communication apparatus which is provided with a plurality of channel units each of which outputs IF signal obtained by modulating carrier of a predetermined frequency with a baseband signal, synthesizes the IF signal output from each channel unit, and emits the synthesized signal from an antenna, said transmission power control apparatus comprising:

an indoor unit; and an outdoor unit;

said indoor unit including:
 a plurality of channel units;
 a synthesizer for synthesizing the IF signals which are output from said plurality of channel units;
 a frequency converter for converting the frequency of said synthesized signal so as to transmit said synthesized signal to said outdoor unit;
 a level control circuit for controlling the level of the signal output from said frequency converter;
 an amplifier for amplifying the output of said level control circuit;
 a detector for detecting the output level of said amplifier;
 a reference voltage generator for outputting a preset reference voltage;
 a controller for instructing each of said channel units whether or not said channel unit should output an IF signal and instructing said reference voltage generator to generate said reference voltage; and
 a comparator for outputting the difference between the voltage detected by said detector and said reference voltage output from said reference voltage generator;

wherein said controller instructs a predetermined channel unit to transmit an IF signal for transmission power control when none of said channel units transmit an IF signal; and when said IF signal is transmitted, said comparator outputs said difference between the detected voltage and said reference voltage; and said level control circuit controls the level of the signal output from the frequency converter so that said difference output from said comparator becomes zero; and said outdoor unit including:
 a frequency converter for converting the frequency of the signal transmitted from said indoor unit into the frequency of an RF signal and outputting said RF signal;
 a level control unit for controlling the level of said RF signal output from said frequency converter;
 a temperature compensator for inputting an output power correction signal corresponding to the temperature of the interior of said outdoor unit to said level control unit; and
 a power amplifier for amplifying the signal output from said level control unit and inputting the amplified signal to the antenna;
 wherein said level control unit controls the level of said RF signal on the basis of said output power correction signal.

4. A transmission power control apparatus in a communication apparatus which is provided with a plurality of channel units each of which outputs an IF signal obtained by modulating a carrier of a predetermined frequency with a baseband signal, synthesizes the IF signal output from each channel unit, and emits the synthesized signal from an antenna, said transmission power control apparatus comprising:

an indoor unit; and an outdoor unit;

said indoor unit including;
 a plurality of channel units;
 a synthesizer for synthesizing the IF signals which are output from said plurality of channel units;
 a frequency converter for converting the frequency of said synthesized signal so as to transmit said synthesized signal to said outdoor unit;
 an amplifier for amplifying the output of said frequency converter;
 a detector for detecting the output level of said amplifier;
 a reference voltage generator for outputting the reference voltage;
 a controller for instructing each of said channel units whether or not said channel unit should output an IF signal;
 a comparator for outputting a difference between the voltage detected by said detector and said reference voltage output from said reference voltage generator;
 a plurality of level control units each of which is provided in each of said channel units;
 a dummy load having the same impedance characteristic as said outdoor unit; and
 a change-over switch for inputting the signal output from said amplifier to either of said outdoor unit and said dummy load;

wherein, when none of said channel units transmit an IF signal, said controller controls said change-over switch so as to connect the output of said power amplifier to said dummy load and instructs a predetermined channel unit to output an IF signal for a predetermined time;

said comparator outputs said difference between the detected voltage and said reference voltage;

said controller inputs said difference to the level control circuit of said predetermined channel unit;

said level control circuit of said predetermined channel unit controls output level so that said difference output from the comparator becomes zero; and said controller changes over serially said predetermined channel unit for outputting said IF signal to another channel unit; and said outdoor unit including:
  a frequency converter for converting the frequency of the signal transmitted from said indoor unit into the frequency of an RF signal and outputting said RF signal;
  a level control unit for controlling the level of said RF signal output from said frequency converter;
  a temperature compensator for inputting an output power correction signal corresponding to the temperature of the interior of said outdoor unit to said level control unit; and
  a power amplifier for amplifying the signal output from said level control unit and inputting the amplified signal to the antenna;
wherein said level control unit controls the level of said RF signal on the basis of said output power correction signal.

* * * * *